United States Patent
Kao

(10) Patent No.: US 12,020,940 B2
(45) Date of Patent: Jun. 25, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventor: Ching-Hung Kao, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 66 days.

(21) Appl. No.: 17/584,814

(22) Filed: Jan. 26, 2022

(65) Prior Publication Data
US 2023/0016468 A1    Jan. 19, 2023

Related U.S. Application Data

(60) Provisional application No. 63/222,258, filed on Jul. 15, 2021.

(51) Int. Cl.
*H01L 21/762* (2006.01)
*H01L 21/28* (2006.01)
(Continued)

(52) U.S. Cl.
CPC .. *H01L 21/28158* (2013.01); *H01L 21/76202* (2013.01); *H01L 29/0649* (2013.01); *H01L 29/4232* (2013.01); *H01L 27/088* (2013.01)

(58) Field of Classification Search
CPC . H01L 21/28; H01L 21/762; H01L 21/28158; H01L 21/76202; H01L 21/76224; H01L 21/76205; H01L 29/06; H01L 29/66; H01L 29/78; H01L 29/423; H01L 29/4232; H01L 29/0649; H01L 29/0684; H01L 29/66553; H01L 27/008; H01L 29/49; H01L 29/51; H01L 29/495;
(Continued)

(56) References Cited

U.S. PATENT DOCUMENTS

| 2013/0334652 A1* | 12/2013 | Piper | H01L 29/0649 |
| | | | 257/506 |
| 2016/0027701 A1* | 1/2016 | Saino | H10B 12/34 |
| | | | 438/294 |

(Continued)

FOREIGN PATENT DOCUMENTS

TW    201916174 A    4/2019

OTHER PUBLICATIONS

Taiwan Office Action issued in connection with TW Appl. Ser. No. 111111085 dated Jul. 7, 2023.

*Primary Examiner* — Chuong A Luu
(74) *Attorney, Agent, or Firm* — FOLEY & LARDNER LLP

(57) ABSTRACT

A method for fabricating semiconductor devices is disclosed. The method includes forming a recess along a top surface of a semiconductor substrate. The method includes forming a nitride-based spacer layer extending along a first sidewall of the recess. The method includes forming a field oxide layer in the recess extending along a bottom surface of the recess, while a lateral tip of the field oxide layer is blocked from extending into any portion of the semiconductor substrate other than the recess by the nitride-based spacer layer.

20 Claims, 16 Drawing Sheets

(51) Int. Cl.
*H01L 29/06* (2006.01)
*H01L 29/423* (2006.01)
*H01L 27/088* (2006.01)

(58) Field of Classification Search
CPC ............ H01L 29/517; H01L 29/4966; H01L 29/0653; H01L 29/0692; H01L 29/42364; H01L 29/66545; H01L 29/66613; H01L 29/66659; H01L 29/7835
USPC .......................................................... 438/140
See application file for complete search history.

(56) References Cited

U.S. PATENT DOCUMENTS

2016/0329329 A1* 11/2016 Chen ................ H01L 21/823821
2018/0061981 A1   3/2018 Zhou
2019/0355570 A1* 11/2019 Hsieh ................ H01L 29/66545

* cited by examiner

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/222,258, filed Jul. 15, 2021, entitled "USING NITRIDE SPACER TO PREVENT GATE OXIDE FROM HAVING A BIRD'S BEAK PROFILE," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
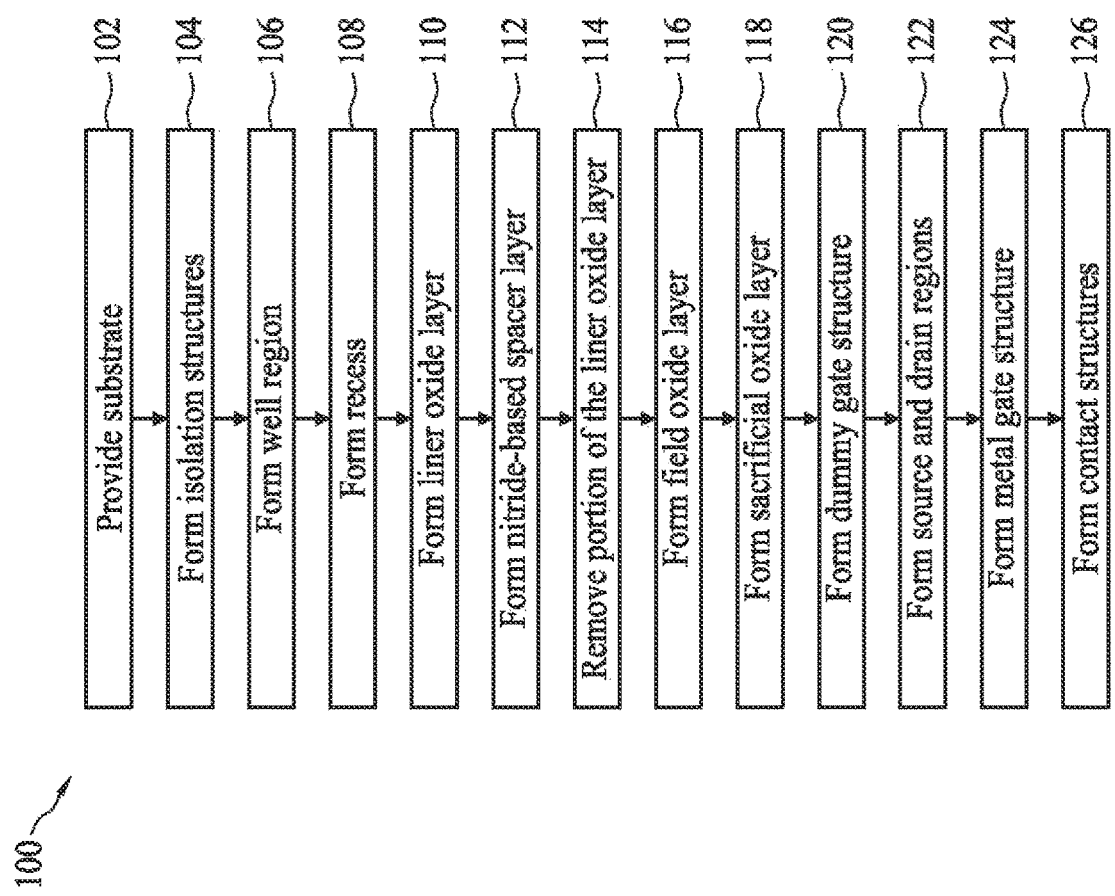
FIG. 1 is an example flow chart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The demand for evermore compact, portable, and low cost consumer electronic devices has driven electronics manufacturers to develop and manufacture integrated circuits (ICs) that operate with low power supply voltages resulting in low power consumption. However, there may be components of the devices that require higher voltages than the low power supply voltage. For example, liquid crystal display (LCD) drivers may use high-voltage (HV) metal-oxide-semiconductor (MOS) transistors for driving LCD pixels.

In general, an HV MOS transistor has an isolation structure. The isolation structure may be, for example, a local oxidation of silicon (LOCOS) structure, under a gate structure (or electrode) of the HV MOS transistor. The LOCOS structure has a thickness in the range of thousands of angstroms. Accordingly, such an HV MOS transistor can have a relatively high operative (e.g., breakdown) voltage applied to the gate electrode. The LOCOS structure is formed by thermally oxidizing the upper portion of a silicon substrate, e.g., converting the upper portion of the silicon substrate into a silicon oxide layer. Due to the nature of thermal oxidation, the LOCOS structure can vertically and laterally expand a certain thickness and distance, respectively. Consequently, the LOCOS structure is commonly formed as having a bird's beak profile at its lateral tip. Such a beak profile can undesirably extend with a certain distance, which does not necessarily provide substantial advantages to improve performance of the transistor. Rather, with such an undesirable lateral extension, it is challenging to shrink dimensions (e.g., a channel length) of the transistor, which can disadvantageously increase the complexity and efforts to integrate the HV MOS transistor with advanced transistors. As a result, the existing HV MOS transistors have not been entirely satisfactory in many aspects.

The present disclosure provides various embodiments of a method to fabricate a high-voltage transistor that has at least a local oxidation of silicon (LOCOS) structure. The method, as disclosed herein, utilizes a nitride-based spacer layer to block lateral extension of the LOCOS structure, thereby minimizing a bird's beak profile (e.g., substantially limiting a laterally extensive distance) of the LOCOS structure. For example, the disclosed method includes forming a recess along a top surface of a silicon substrate, and blocking a sidewall of the recess with the nitride-based spacer layer while forming the LOCOS structure. As such, the LOCOS structure can be confined within the recess, i.e., without laterally extending into other portion of the silicon substrate where the LOCOS structure is not supposed to be formed. In some embodiments, the high-voltage transistor can have the LOCOS structure formed by the disclosed method operatively serve as a portion of a gate dielectric layer. Further, such a high-voltage transistor can have its source and drain regions asymmetrically arranged with respect to the LOCOS structure. In some other embodiments, the high-voltage transistor can have the LOCOS structure push its drain region away from its gate structure thereby defining an extended drift region. With any of the foregoing configurations, the LOCOS structure, formed by the disclosed method, can decrease dimensions (e.g., a channel length) of the corresponding high-voltage transistor, which can advantageously make the high-voltage transistor more scalable with those ever increasingly shrunk devices that operate under a relatively low voltage.

FIG. 1 illustrates a flowchart of an example method 100 for forming at least a portion of a semiconductor device 200, in accordance with some embodiments. It should be noted that the method 100 is merely an example, and is not intended to limit the present disclosure. Accordingly, it is understood that the order of operation of the method 100 of FIG. 1 can change, that additional operations may be provided before, during, and after the method 100 of FIG. 1, and that some other operations may only be described briefly herein. In some embodiments, operations of the method 100 may be associated with cross-sectional or top views of the example semiconductor device 200 at various fabrication stages as shown in FIGS. 2, 3, 4, 5, 6, 7, 8, 9, 10, 11, 12, 13, 14, 15, and 16.

Further, the semiconductor device 200 shown in FIGS. 2-16 can include one or more transistors formed in a first area of a substrate that operate under a relatively high gate and drain voltages (e.g., above about 20V). Hereinafter, these transistors are referred to as high-voltage transistors. It should be appreciated that at least some of the operations of the method 100 of FIG. 1 can be shared (e.g., concurrently performed) to form one or more transistors in a second area of the same substrate that operate under a relatively low gate and/or drain voltage. Hereinafter, these transistors are referred to as low-voltage or middle-voltage transistors. Each of the transistors has a conduction type such as, for example an n-type transistor or a p-type transistor. The term "n-type," as used herein, may be referred to as the conduction type of a transistor having electrons as its conduction carriers; and the term "p-type," as used herein, may be referred to as the conduction type of a transistor having holes as its conduction carriers.

In a brief overview, the method 100 starts with the operation 102 in which a substrate is provided. The method 100 continues to operation 104 in which a number of isolation structures are formed. The method 100 continues to operation 106 in which a well region is formed. The method 100 continues to operation 108 in which a recess is formed. The method 100 continues to operation 110 in which a liner oxide layer is formed. The method 100 continues to operation 112 in which a nitride-based spacer layer is formed. The method 100 continues to operation 114 in which a portion of the liner oxide layer is removed. The method 100 continues to operation 116 in which a field oxide layer is formed. The method 100 continues to operation 118 in which a sacrificial oxide layer is formed. The method 100 continues to operation 120 in which a dummy gate structure is formed. The method 100 continues to operation 122 in which a source region and a drain region are formed. The method 100 continues to operation 124 in which a metal gate structure is formed. The method 100 continues to operation 126 in which a number of contact structures are formed.

Figure 2:
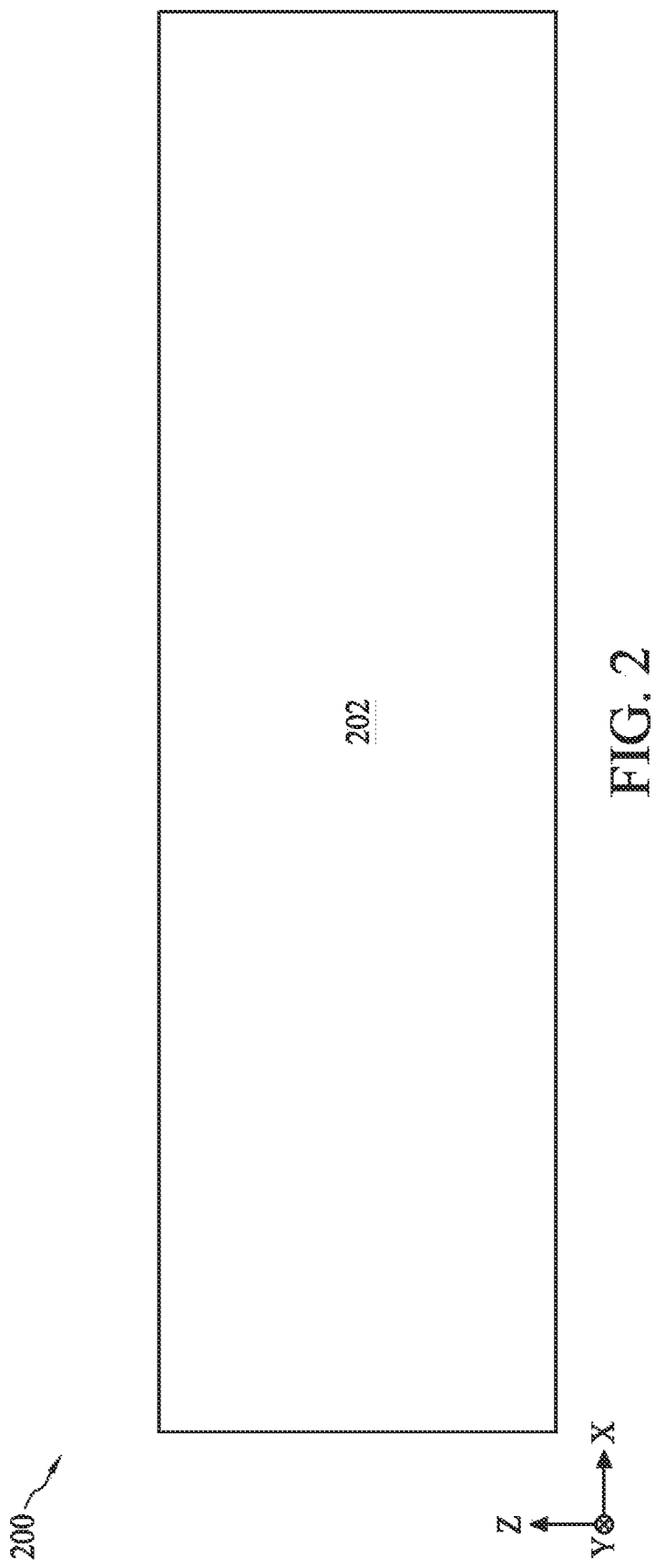
FIGS. 2, 3, 4, 5, 6, 7, 8, 9, 10, 11, 12, 13, 14, 15, and 16 each illustrate a cross-sectional view or a top view of an example semiconductor device during various fabrication stages, made by the method of FIG. 1, in accordance with some embodiments.

Corresponding to operation 102 of FIG. 1, FIG. 2 is a cross-sectional view cut along the X-direction of the semiconductor device 200 including a substrate 202, in accordance with some embodiments. As mention above, the substrate 202 may have a first area and a second area, where one or more high-voltage transistors and low/middle-voltage transistors are formed, respectively. The cross-sectional views of FIG. 2 (and the following figures) are directed to such a first area.

The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
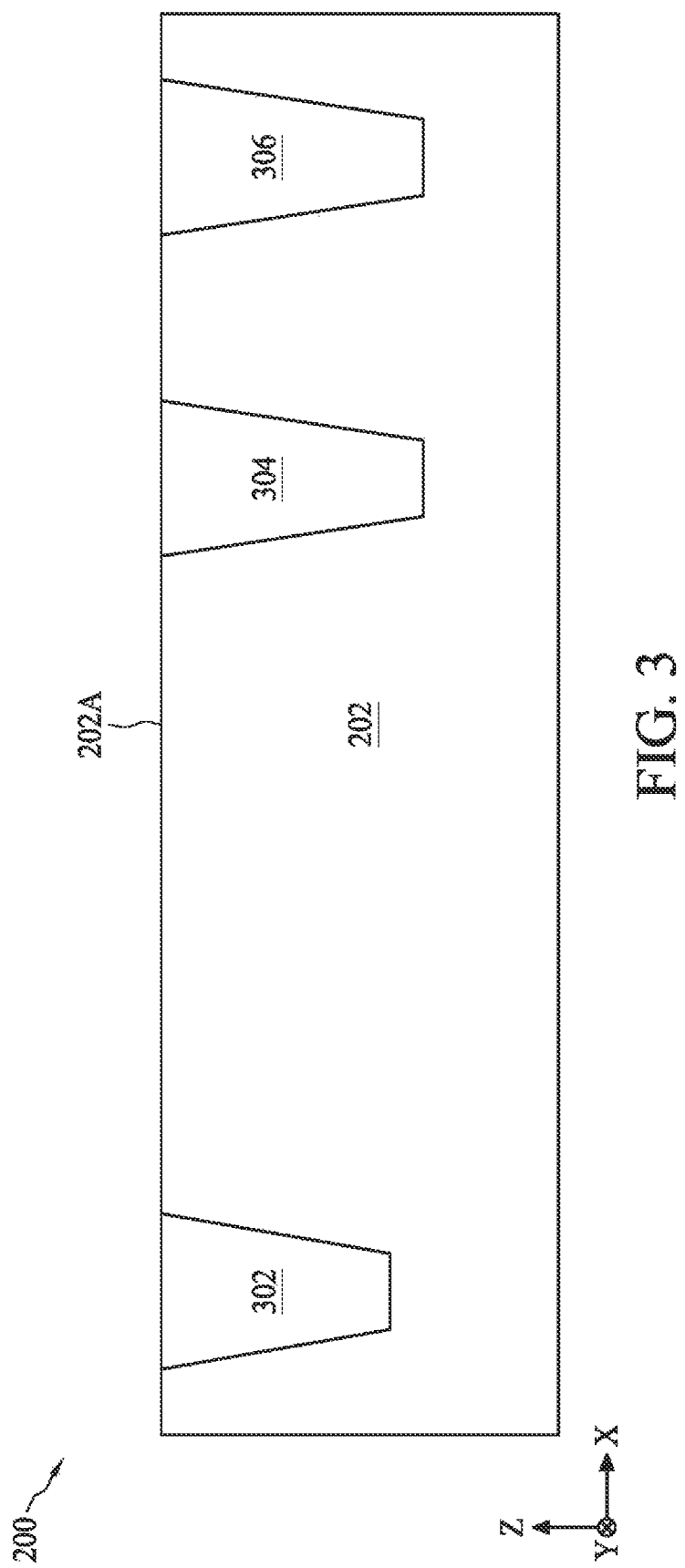

Corresponding to operation 104 of FIG. 1, FIG. 3 is a cross-sectional view cut along the X-direction of the semiconductor device 200 including a number of isolation structures 302, 304, and 306, in accordance with some embodiments. The isolation structures 302 and 306, which are formed of an insulation material, can electrically isolate neighboring device features from each other, for example, isolating the to-be formed high-voltage transistor from other transistors formed on the substrate. The isolation structure 304, which is formed of the same insulation material, can help release an electric field under a gate electrode of the to-be formed high-voltage transistor and that is formed next to a drain region of the to-be formed high-voltage transistor.

As an example, the formation of the isolation structures 302-306 may include dry etching a number of trenches extending into the substrate 202 and filling the trenches with insulation materials such as silicon oxide, silicon nitride, or silicon oxynitride. In some embodiments, the isolation structures 302-306 may sometimes be referred to as shallow trench isolation (STI) structures. The insulation material may be formed (to fill the trenches) by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. The filled trenches may each have a multi-layer structure such as a thermal oxide liner layer filled with silicon nitride or silicon oxide.

In general, the isolation structures 302-306 may be formed using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride. In some embodiments, the depth of the isolation structures 302-306 is in the range of approximately 0.2 micron meters (m) to about 0.5 m as measured vertically from a top surface of the substrate 202A, depending on the device technology. In some other embodiments, the isolation structures 304 near the drain region may have a full isolation structure similar as the isolation structures 302 and 306, or may include a number of partially slotted structures.

Figure 4:
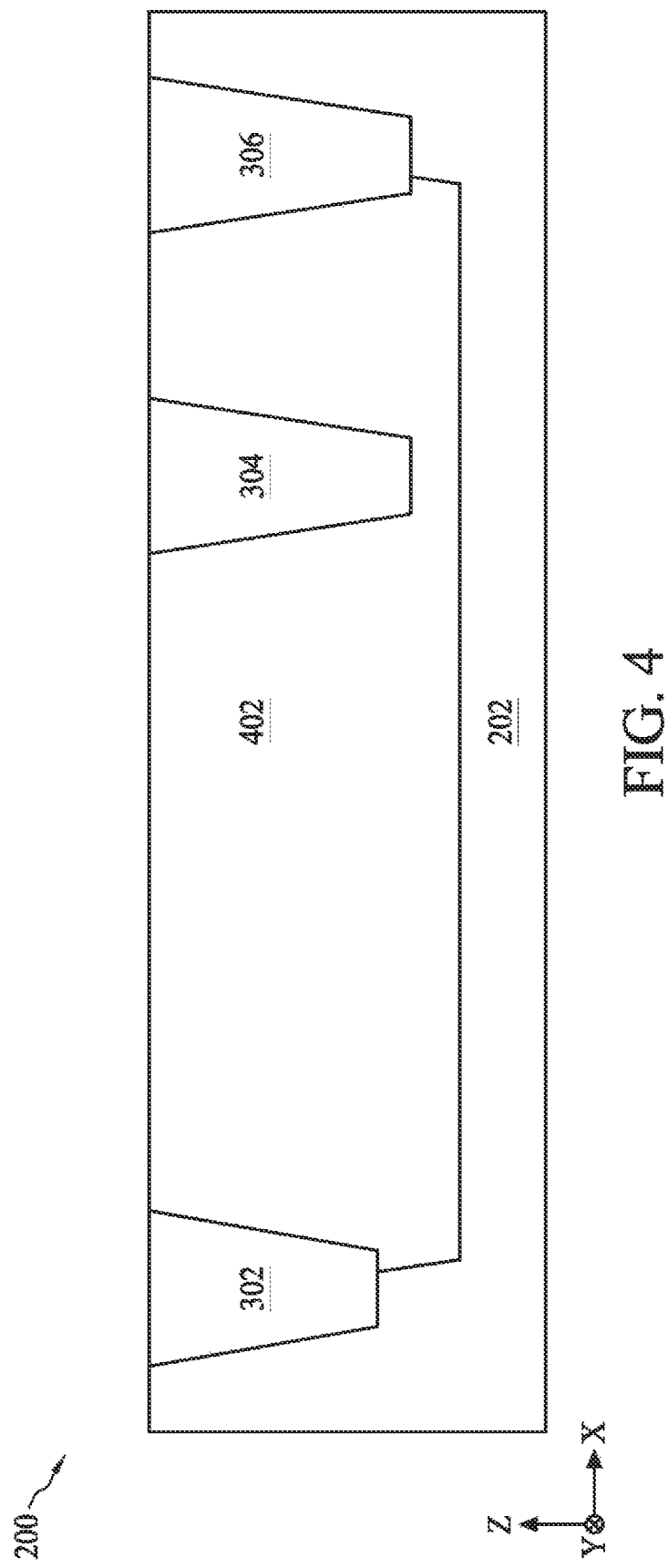

Corresponding to operation 106 of FIG. 1, FIG. 4 is a cross-sectional view cut along the X-direction of the semiconductor device 200 including a well region 402, in accordance with some embodiments.

The well region 402 may be doped with a type of dopants in a concentration. For example, to form the high-voltage transistor as an n-type transistor for the semiconductor device 200, the well region 402 may be silicon doped with a p-type dopant such as boron (B), aluminum (Al), indium (In), gallium (Ga), or any other suitable p-type dopants. In another example, to form the high-voltage transistor as a p-type transistor for the semiconductor device 200, the well region 402 may be silicon doped with an n-type dopant such as phosphorus (P), arsenic (As), antimony (Sb), or any other suitable n-type dopants. In some additional or alternative embodiments, within the well region 402, a sub-well region (not shown), doped with the opposite type of dopants to the well region 402, may be formed. Such a sub-well region, configured to further release an electrical field induced by the gate structure of the to-be formed high-voltage transistor, can be laterally disposed around the isolation structure 304.

Figure 5:
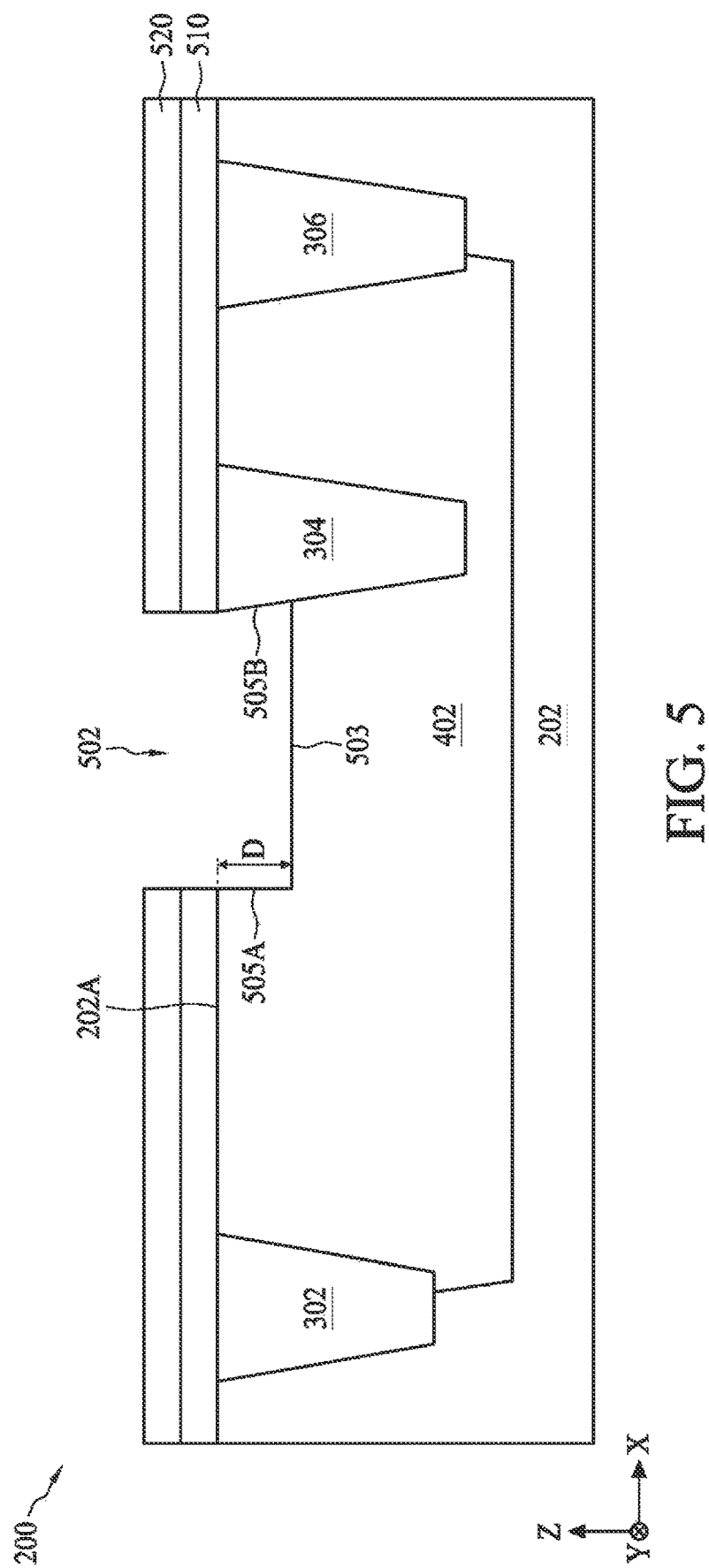

Corresponding to operation 108 of FIG. 1, FIG. 5 is a cross-sectional view cut along the X-direction of the semiconductor device 200 including a recess 502, in accordance with some embodiments.

As shown, the recess 502 is formed in the well region 402 and next to the isolation structure 304, thereby exposing a portion of a sidewall of the isolation structure 304. Upon the recess 502 being formed, a bottom surface 503 and sidewalls 505A and 505B are defined, wherein the sidewall 505B exposes the portion of the sidewall of the isolation structure 304.

As an example, the recess 502 may be formed using a processing sequence such as: growing a pad oxide 510 over the substrate 202, forming a low pressure chemical vapor deposition (LPCVD) nitride-based (e.g., silicon nitride) layer 520 over the pad oxide 510, patterning the layers 510 and 520 using photoresist and masking to form an opening that defines a position of the recess 502, and etching the substrate 202 (or the well region 402) through the opening. In some embodiments, the recess 502 has a depth, "D," vertically measured from the top surface 202A of the substrate to the bottom surface 503 of the recess. The depth D may be controlled based on the growth rate of a later formed field oxide layer. For example, when the field oxide layer can be grown to about 800-1200 angstroms (Å) within a certain time window according to a certain growth rate, the depth D may be controlled to be about a half of the thickness of the field oxide layer, i.e., about 400-600 Å. As such, a top surface of the field oxide layer may be coplanar with the top surface 202A of the substrate, which will be discussed below.

Figure 6:
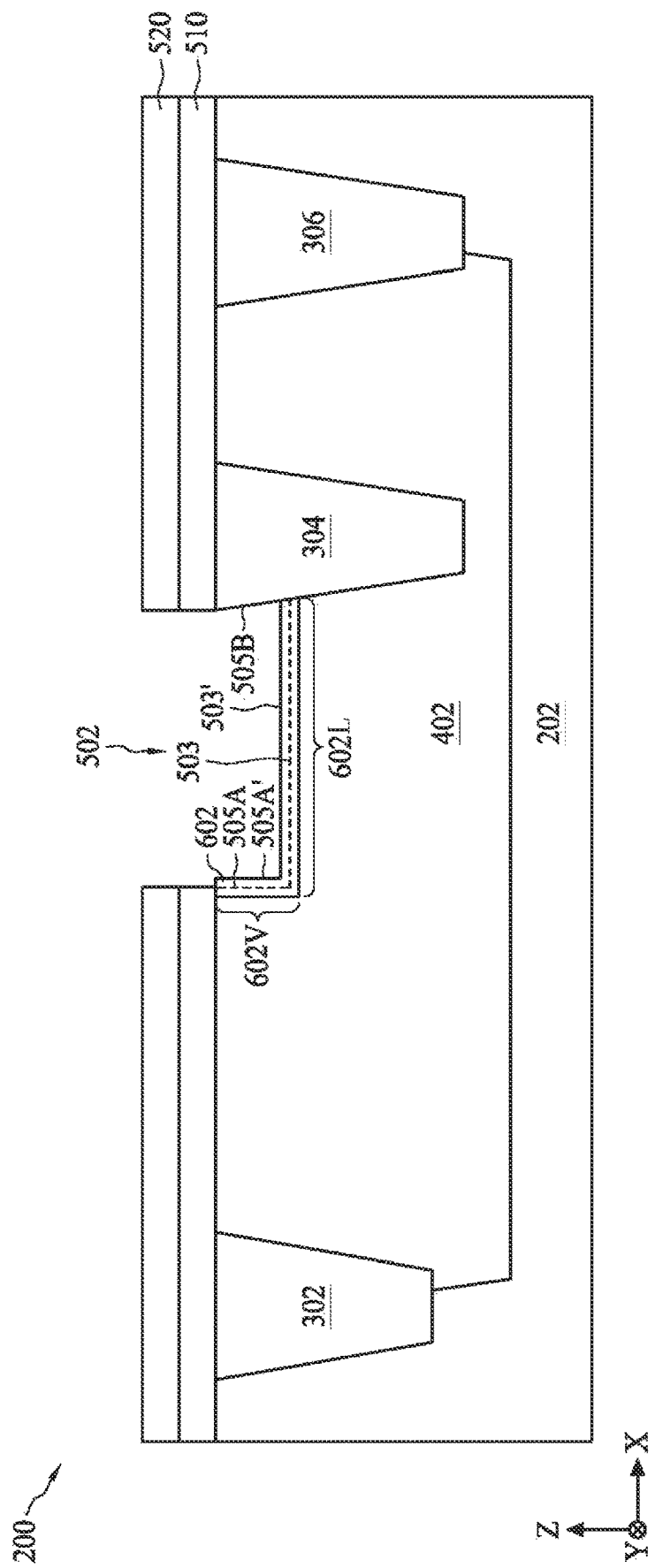

Corresponding to operation 110 of FIG. 1, FIG. 6 is a cross-sectional view cut along the X-direction of the semiconductor device 200 including a liner oxide layer 602, in accordance with some embodiments.

The liner oxide layer 602 may be formed in the recess 502. For example, the liner oxide layer 602 is formed to line the sidewall 505A and the bottom surface 503 of the recess 502. Specifically, the liner oxide layer 602 may be formed by a thermally oxidation process, which can consume portions of silicon of the well region 402. As such, the liner oxide layer 602 can have a vertical portion 602V laterally expanded from the original sidewall 505A (in dotted line of FIG. 6) and a lateral portion 602L vertically expanded from the original bottom surface 503 (in dotted line of FIG. 6). Upon forming the liner oxide layer 602, one of the sidewalls (505A) and the bottom surface (503) of the recess 502 may be redefined as 505A' and 503', respectively, as shown in FIG. 6.

Figure 7:
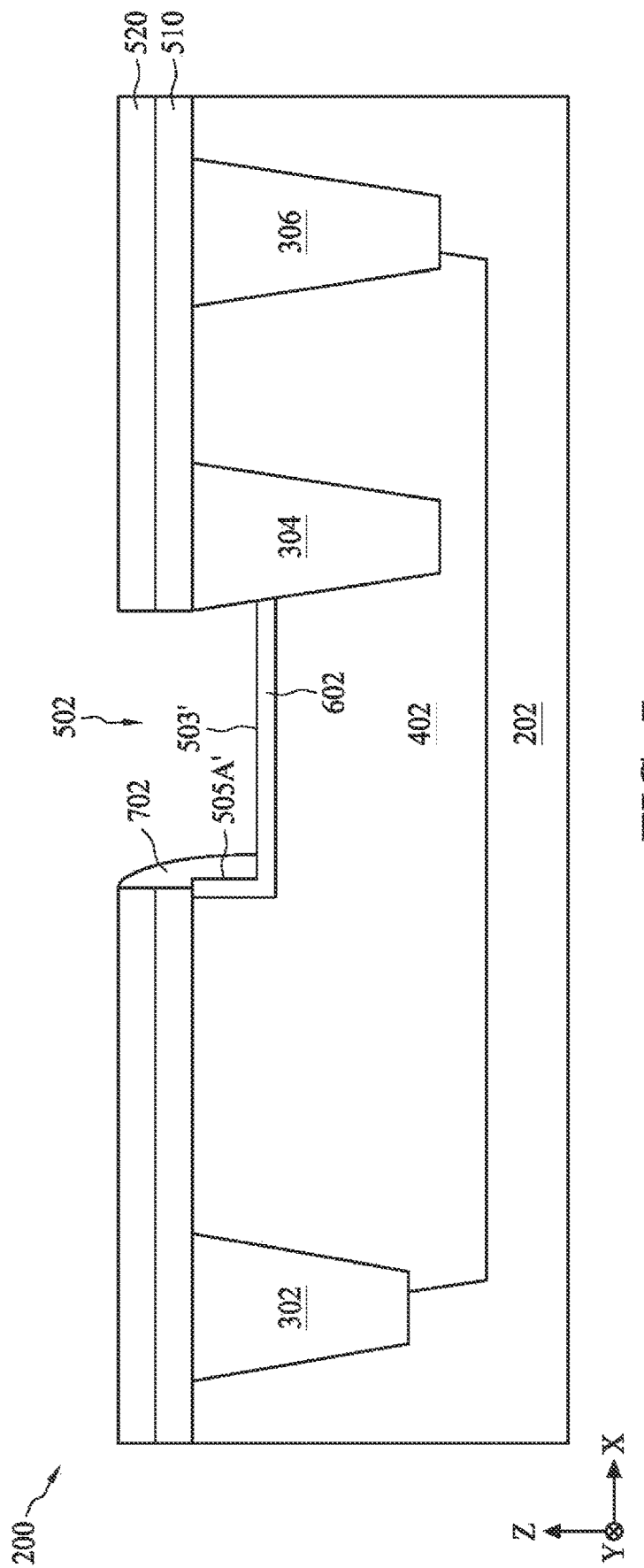

Corresponding to operation 112 of FIG. 1, FIG. 7 is a cross-sectional view cut along the X-direction of the semiconductor device 200 including a nitride-based spacer layer 702, in accordance with some embodiments.

The nitride-based spacer layer 702 is formed to extend along at least the sidewall 505A' of the recess 502. According to various embodiments, the nitride-based spacer layer 702 is configured to block a later formed field oxide layer from laterally extending into a portion of the well region 402 where the field oxide layer is not supposed to be formed. In other words, the field oxide layer can be somehow confined in the recess 502, without overly extending beyond the nitride-based spacer layer 702. In some embodiments, the nitride-based spacer layer 702 is formed by depositing a low pressure chemical vapor deposition (LPCVD) nitride-based (e.g., silicon nitride, silicon carbon nitride, silicon oxycarbide nitride, or combinations thereof) blanket layer, followed by an etching process to pattern the blanket layer. In some embodiments, the blanket layer, formed as a conformal layer, may have a thickness of about 50-200 Å. The etching process may be anisotropic. As such, the portions of the blanket layer that laterally extend over the bottom surface 503' and the layer 520 are mostly removed, with the remaining (or patterned) portion of the blanket layer formed as the nitride-based spacer layer 702.

Figure 8:
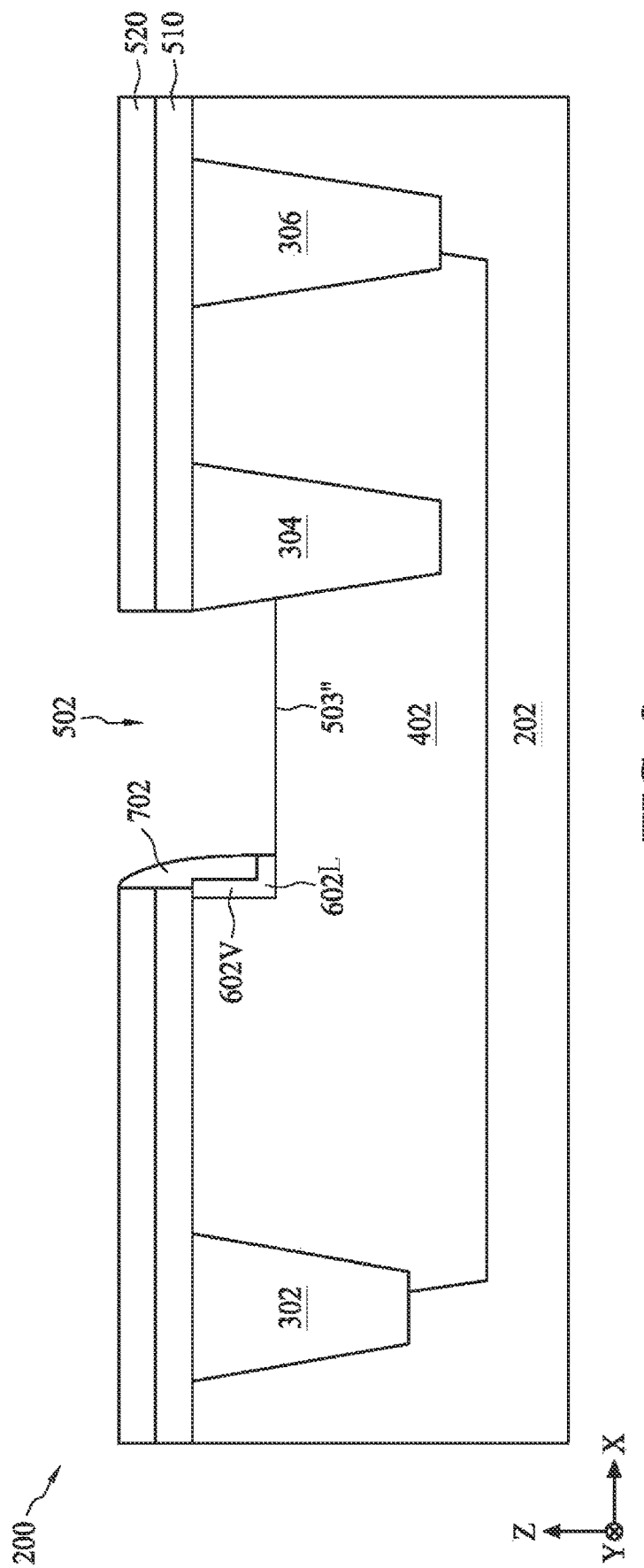

Corresponding to operation 114 of FIG. 1, FIG. 8 is a cross-sectional view cut along the X-direction of the semiconductor device 200 in which a portion of the liner oxide layer 602 is removed, in accordance with some embodiments.

As shown, the portion of the lateral portion of the liner oxide layer 602 that is not covered by the nitride-based spacer layer 702 is removed, e.g., by a wet etching process. Consequently, a surface of the well region 402 that contains silicon is exposed, which again newly defines the bottom surface of the recess 502 as 503". Such an exposed surface of the well region 402 is configured to form a field oxide layer confined therein, which will be discussed as follows.

Figure 9:
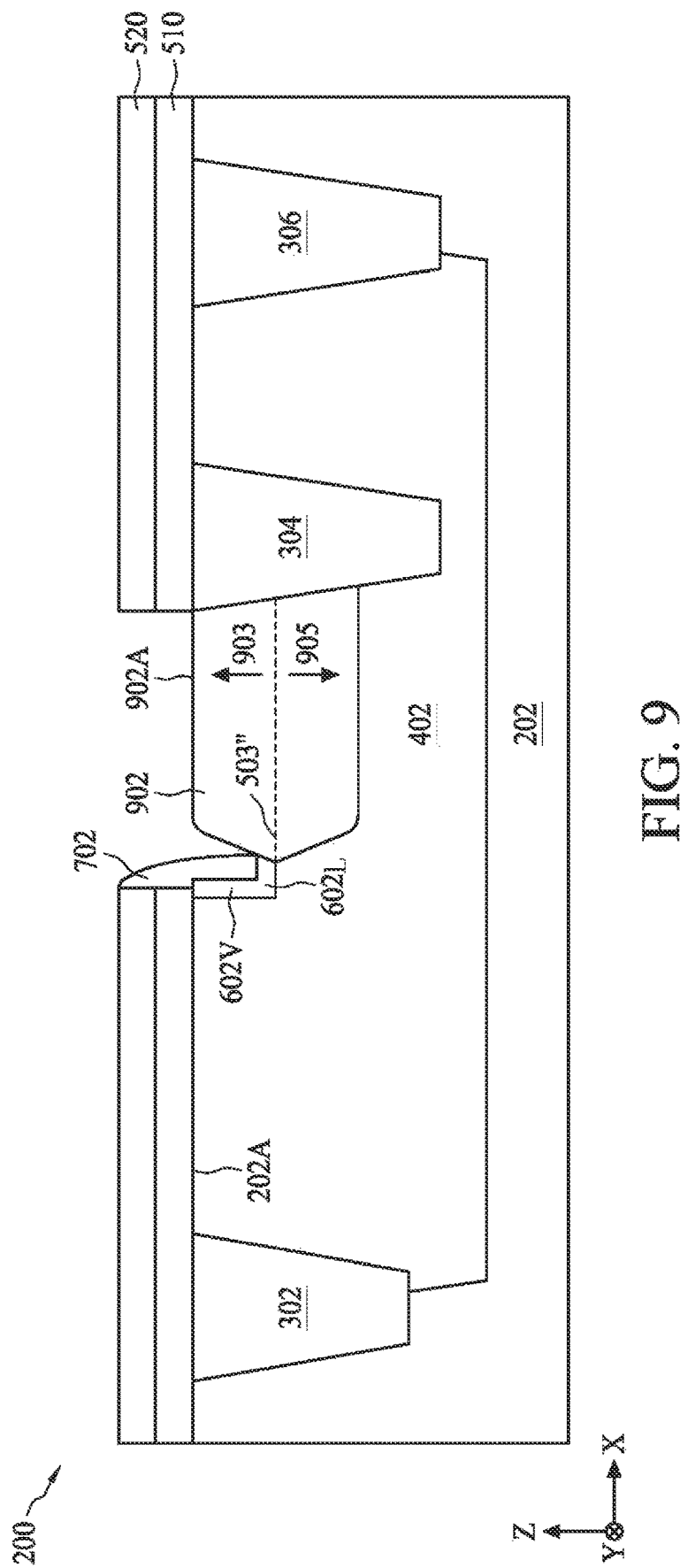

Corresponding to operation 116 of FIG. 1, FIG. 9 is a cross-sectional view cut along the X-direction of the semiconductor device 200 including a field oxide layer 902, in accordance with some embodiments.

The field oxide layer 902, which essentially contains silicon oxide, is formed by thermally oxidizing the exposed surface of the well region 402 that contains silicon. The field oxide layer 902 may sometimes be referred to as a local oxidation of silicon (LOCOS) structure. For example, the field oxide layer 902 can be formed by heating the workpiece in the presence of oxygen at a temperature of about 980° C. It should be understood that other processing conditions may be used to form the thermally oxidized LOCOS structure. With the nitride-based spacer layer 702 terminating a diffusion path of the oxygen into portions of the well region 402 other than the recess 502, the field oxide layer 902 may be formed to vertically expand from the bottom surface 503", as indicated by symbolic arrows 903 and 905, respectively.

In some embodiments, a ratio of the upward expansion (903) and the downward expansion (905) may be about 1. Further, the thermal oxidation process may be controlled to terminate until a top surface 902A of the field oxide layer is formed to be substantially coplanar with the top surface of the 202A of the substrate. As shown, a majority of the top surface 902A is formed as a substantially flat surface that is coplanar with the top surface 202A. Following the foregoing example where the recess 502 has the depth D of about 400-600 Å, the field oxide layer 902 may have a thickness of about 800-1200 Å. However, it should be understood that the field oxide layer 902 may alternately comprise other thicknesses and materials, while remaining within the scope of the present disclosure. In some embodiments, upon forming the field oxide layer 902, the layers 510 and 520, (the remaining portion of) the oxide liner layer 602, and the nitride-based spacer layer 702 may be removed.

More specifically, with the nitride-based spacer layer 702 formed as a blocking layer, the field oxide layer 902 can have a tip terminated at the lateral portion 602L or the nitride-based spacer layer 702. Even though, in some scenarios, the tip may be formed to have a bird's beak, it should be understood that such a tip of the disclosed field oxide layer 902 does not overly extend beyond the nitride-based spacer layer 702, allowing a source region of the to-be formed high-voltage transistor to be formed closer to the tip. In turn, a channel length of the to-be formed high-voltage transistor can be significantly reduced. On the other side of the field oxide layer 902, the field oxide layer 902 and the isolation structure 304 may merge. In the example where the field oxide layer 902 and the isolation structure 304 are both formed of silicon oxide, the field oxide layer 902 and the isolation structure 304 may be formed as a one-piece structure. Nevertheless, the isolation structure 304 extends into the well region 402 with a deeper depth than the field oxide layer 902 does, in some embodiments. The deeper isolation structure 304 can help extend or otherwise define a drift region for the high-voltage transistor, which will be discussed below.

Figure 10:
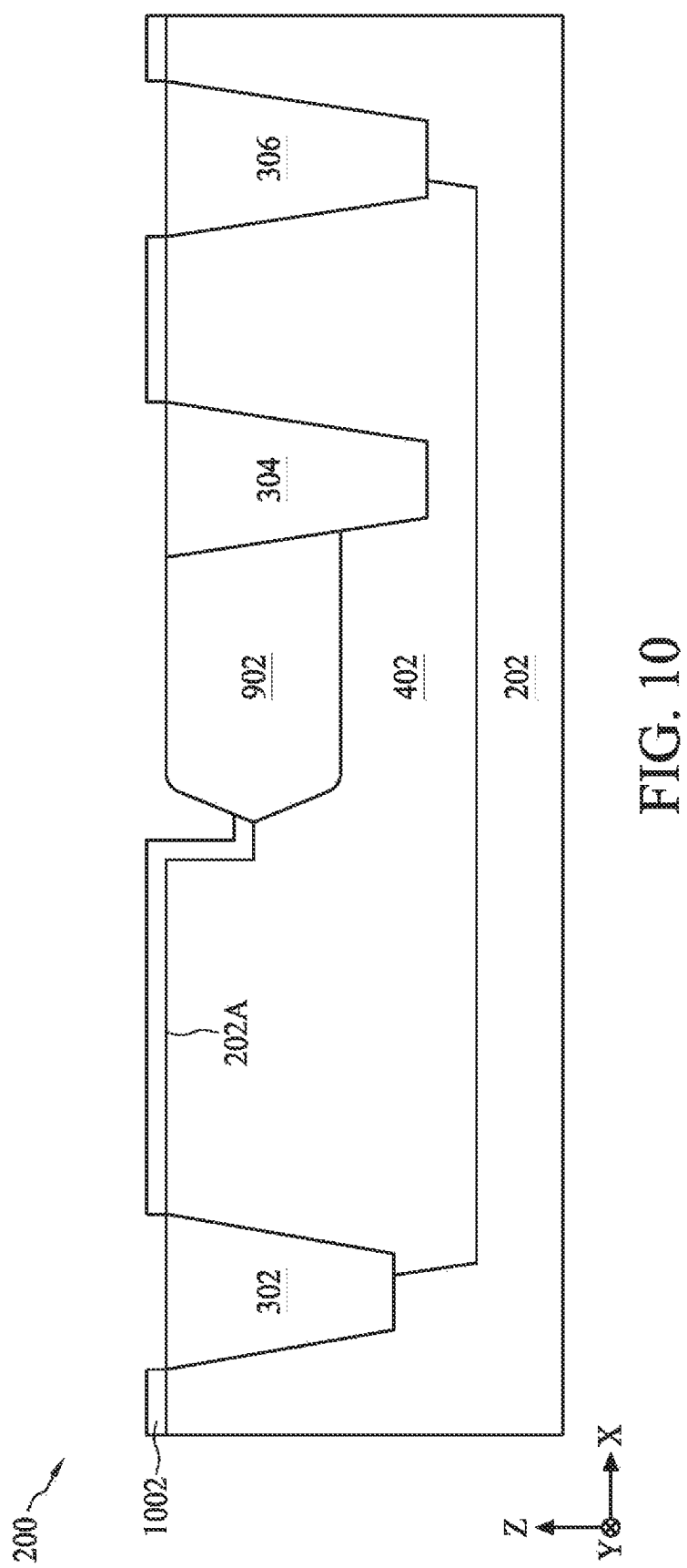

Corresponding to operation 118 of FIG. 1, FIG. 10 is a cross-sectional view cut along the X-direction of the semiconductor device 200 including a sacrificial oxide layer 1002, in accordance with some embodiments.

As mentioned above, some of the operations of the method 100 of FIG. 1 can be concurrently performed on the second area of the substrate 202 to form a number of low/middle-voltage transistors. In some embodiments, upon forming the field oxide layer 902 (which is configured to function as a gate dielectric layer of the to-be formed high-voltage transistor), the sacrificial oxide layer 1002 may be universally formed over the first area (shown in FIG. 10) and the second area (not shown) of the substrate 202. The sacrificial oxide layer 1002 can be formed prior to forming one or more doped well regions in the second area, which is typically characterized with a higher concentration than the doping concentration of the well region 402 in the first area. As such, the transistors formed in the first area can have a higher operation (e.g., breakdown) voltage than the transistors formed in the second area. In some embodiments, the sacrificial oxide layer 1002 may be removed after the doping process in the second area. Subsequently to removing the sacrificial oxide layer 1002, the following operations of the method 100 of FIG. 1 may be concurrently performed in the first area and second area to form a number of high-voltage transistors and a number of low/middle-voltage transistors, respectively.

Figure 11:
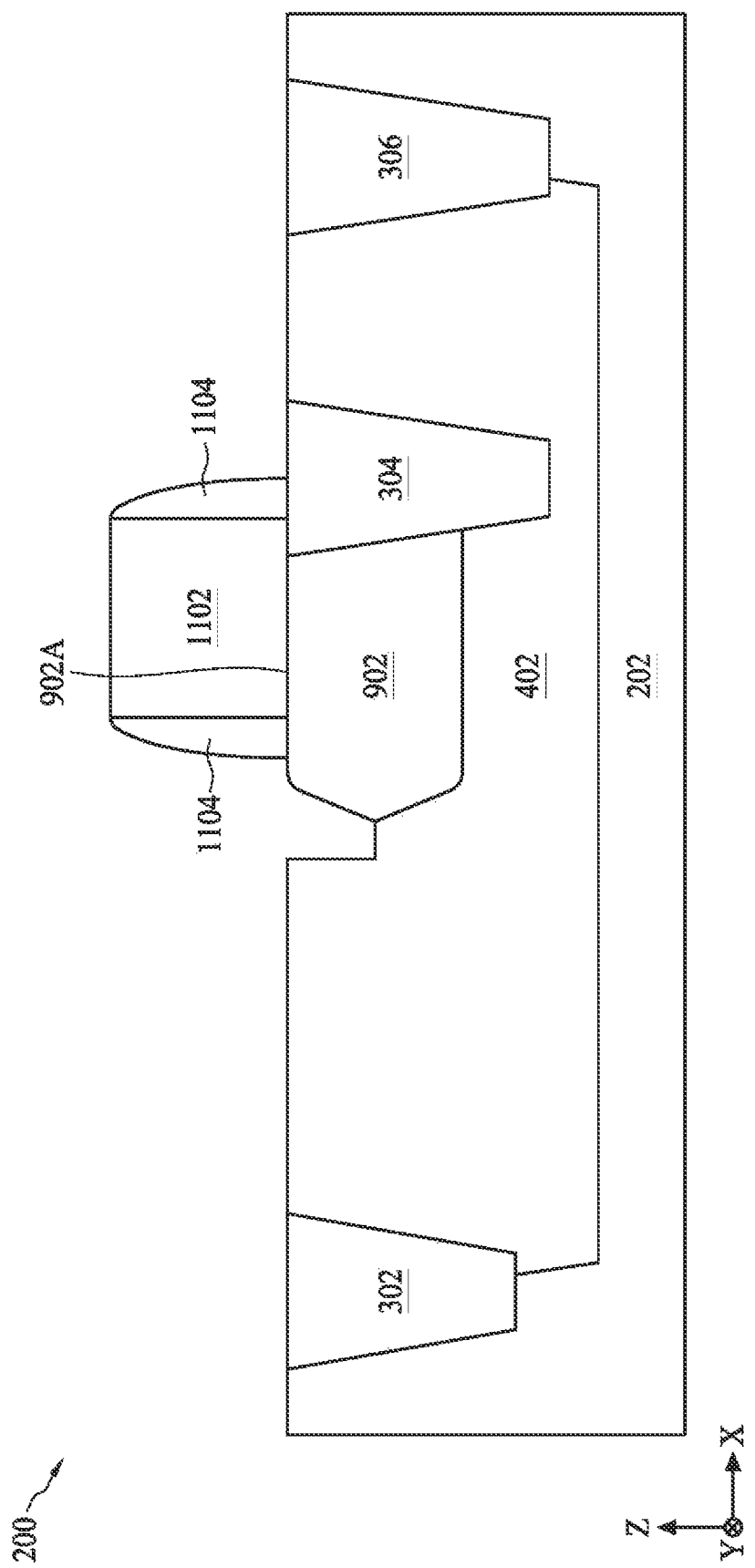

Corresponding to operation 120 of FIG. 1, FIG. 11 is a cross-sectional view cut along the X-direction of the semiconductor device 200 including a dummy gate structure 1102, in accordance with some embodiments.

In some embodiments, the dummy gate structure 1102 may be formed over the field oxide layer 902 and, as shown in FIG. 11. Specifically, the dummy gate structure 1102 may be formed over the substantially flat portion of the top surface 902A of the field oxide layer and a portion of the top surface of the isolation structure 304. Upon forming the dummy gate structure 1102, gate spacers 1104 may be formed on opposite sides of the dummy gate structure 1102. The gate spacers 1104 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1104.

The dummy gate structure 1102 includes a number of layers stacked on top of one another. For example, the dummy gate structure 1102 includes a dummy gate dielectric and a dummy gate, in some embodiments. To form the dummy gate structure 1102, a dielectric layer is formed over the substrate 202. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Next, a gate layer is formed over the dielectric layer, and a mask layer is formed over the gate layer. The gate layer may be deposited over the dielectric layer and then planarized, such as by a CMP. A mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using suitable lithography and etching techniques. The pattern of the mask then may be transferred to the gate layer and the dielectric layer by a suitable etching technique to form the dummy gate structure 1102.

Figure 12:
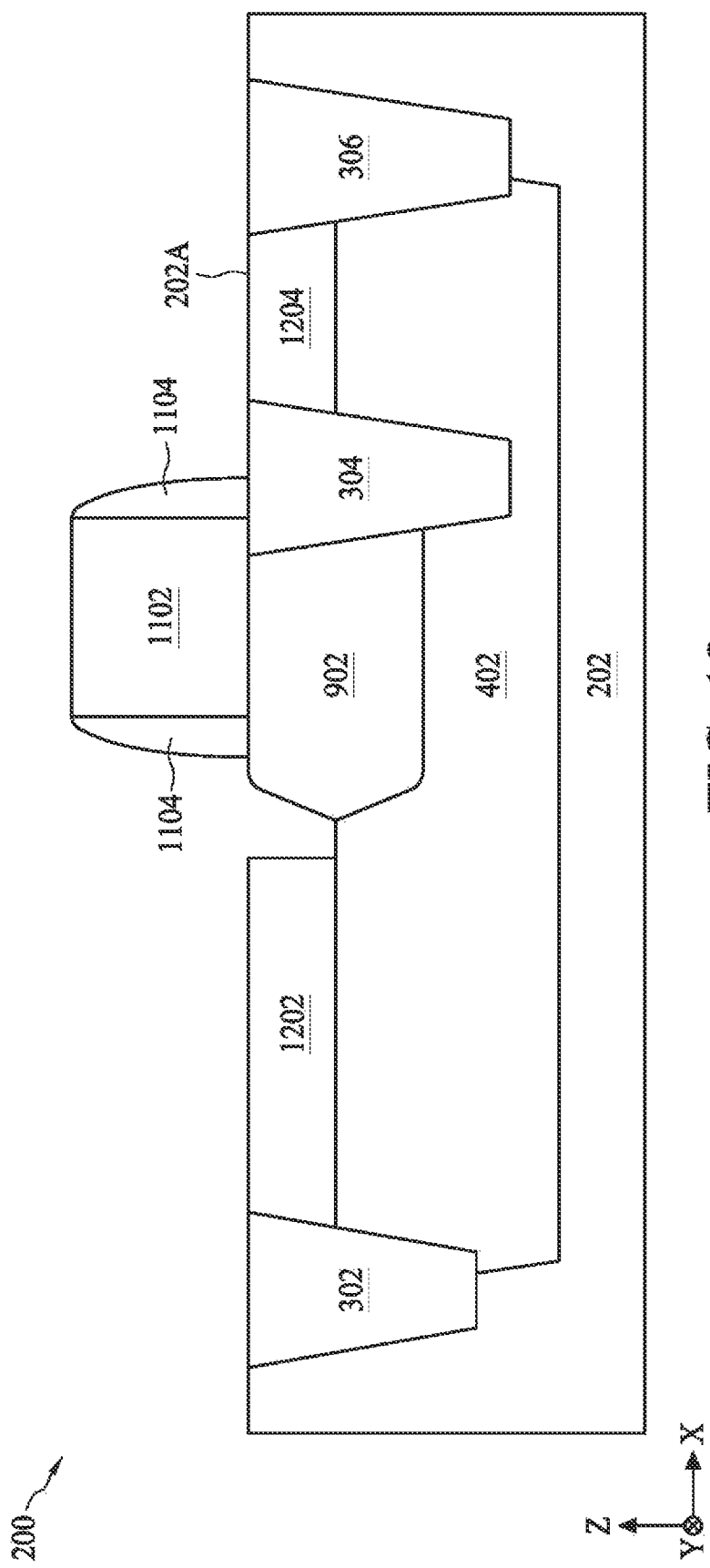

Corresponding to operation 122 of FIG. 1, FIG. 12 is a cross-sectional view cut along the X-direction of the semiconductor device 200 including a source region 1202 and a drain region 1204, in accordance with some embodiments.

As shown, the source region 1202 and drain region 1204 are formed along the top surface 202A of the substrate by implanting dopants into the well region 402. The type of dopants used to form the source region 1202 and drain region 1204 may be opposite to the dopant type of the well region 402. The source region 1202 may be formed laterally next to the tip of the field oxide layer 902, with an L-shaped recess in the well region 402 interposed therebetween. Although a bottom boundary of the source region 1202 is formed above the corner of the L-shaped profile in the illustrated embodiment of FIG. 12, it should be understood that such a bottom boundary may extend below the corner of the L-shaped profile, while remaining within the scope of the present disclosure. The drain region 1204 may be formed laterally between the isolation structures 304 and 306.

When the to-be formed high-voltage transistor is configured as n-type, the source region 1202 and the drain region 1204 may be doped with an n-type dopant such as phosphorus (P), arsenic (As), antimony (Sb), or any other suitable n-type dopant. When such a high-voltage transistor is configured as p-type, the source region 1202 and the drain region 1204 may be doped with a p-type dopant such as boron (B), aluminum (Al), indium (In), gallium (Ga), or any other suitable p-type dopant. The source region 1202 and the drain region 1204 may be doped in a concentration higher than the doping concentration of the well region 402, in accordance with some embodiments.

Figure 13:
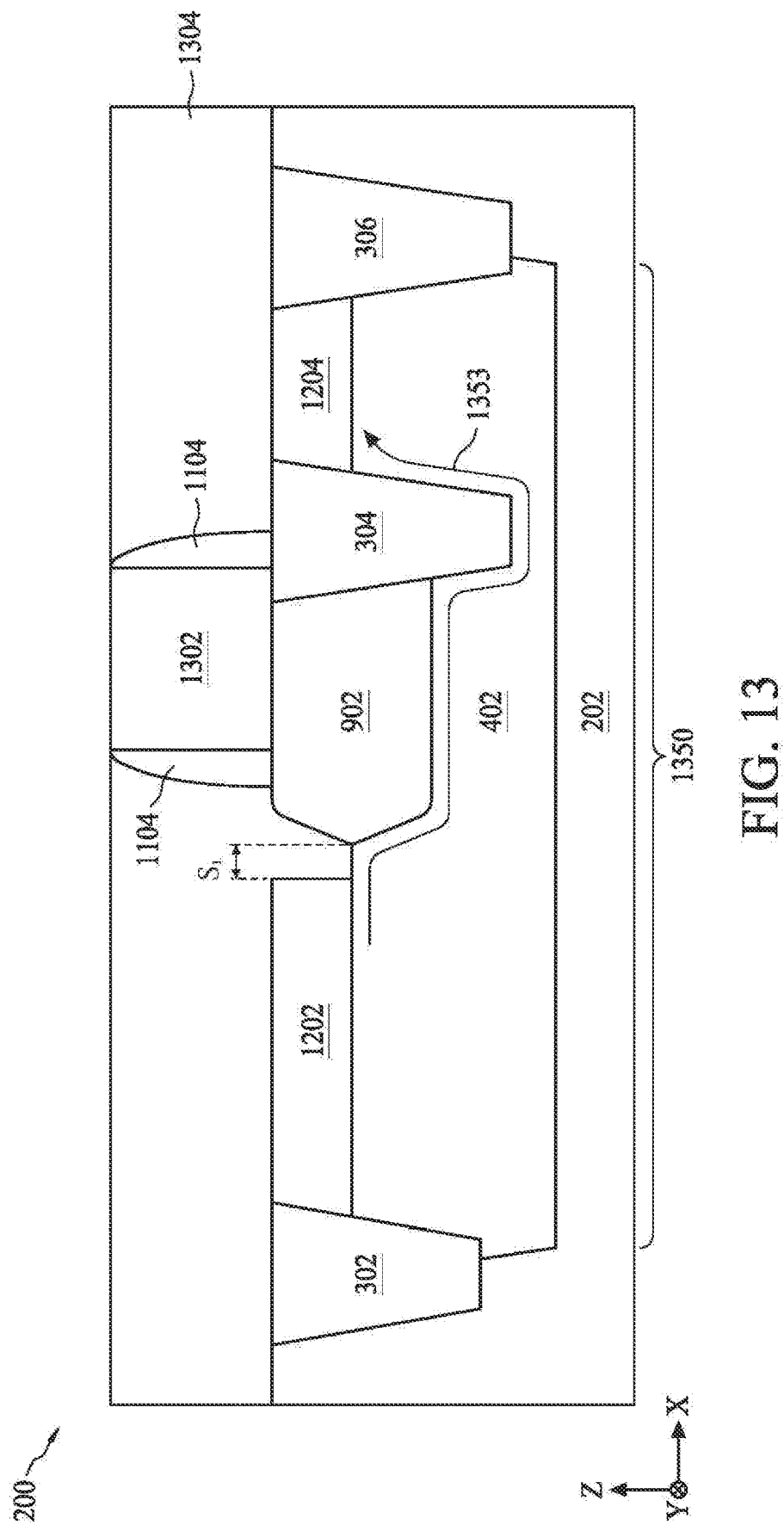

Corresponding to operation 124 of FIG. 1, FIG. 13 is a cross-sectional view cut along the X-direction of the semiconductor device 200 including a metal gate structure 1302, in accordance with some embodiments.

Upon forming the source region 1202 and the drain region 1204, a first interlayer dielectric (ILD) 1304 is formed over the substrate 202. The first ILD 1304 is formed of a dielectric material such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD.

Next, a gate replacement process is performed to replace the poly gate structure 1102 (FIG. 12) with the metal gate structure 1302. In some embodiments, the metal gate structure 1302 can include a number of layers stacked on top of one another. For example, the metal gate structure 1302 can include a high-k dielectric layer and a metal gate layer.

The high-k dielectric layer may include may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k dielectric layer may include a stack of multiple high-k dielectric layers. The high-k dielectric layer may be deposited using any suitable method, including, for example molecular beam deposition (MBD), atomic layer deposition (ALD), PECVD, and the like.

The metal gate layer can include a p-type work function layer, an n-type work function layer, multi-layers thereof, or combinations thereof. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. The work function layer(s) may be deposited by CVD, physical vapor deposition (PVD), ALD, and/or other suitable process. After depositing the one or more work function layers, a planarization process such as a CMP process may be performed to remove the excess metal.

After the formation of the metal gate structure 1302, a high-voltage transistor 1350 can be formed. The high-voltage transistor 1350 may be any suitable transistor such as, but not limited to, a field-effect transistor (FET). In accordance with various embodiments, the high-voltage transistor 1350 may be constituted at least by the isolation structure 304, the well region 402, the field oxide layer 902, the source region 1202, the drain region 1204, and the metal gate structure 1302. Specifically, the field oxide layer 902 can function as a part of a gate dielectric layer of the high-voltage transistor 1350. With its relatively thick thickness (e.g., about 800-1200 Å), the field oxide layer 902 can tolerate a relatively high voltage applied to the metal gate structure 1302, typically greater than 20 V. With such a strong electrical field induced from the gate structure, the isolation structure 304 that extends into the well region 402 farther than the field oxide layer 902 can create a drift region to release the strong electric field.

As shown, a symbolic arrow 1353 indicates a current flow, when the high-voltage transistor 1350 in an on-state condition, that originates from the source region 1202, travels along a bottom boundary (or surface) of the field oxide layer 902 and along a lower portion of the isolation structure 304, and arrives at the drain region 1204. The lower portion of the isolation structure 304 can serve as the drift region (e.g., configured to release the high gate electrical field), in some embodiments. A transistor, having an isolation structure formed on one of the sides of a field oxide layer, can sometimes be referred to as an asymmetrical transistor. It should be understood that the methods (e.g., method 100 of FIG. 1), as disclosed herein, are not limited to fabricating the field oxide layer for an asymmetrical transistor. For example, the disclosed methods may also be applied to formation of symmetrical transistors (e.g., with another isolation structure formed on the source side of the field oxide layer, or without the isolation structure formed on any side of the field oxide layer).

Further, by forming the field oxide layer 902 using the currently disclosed methods, a lateral extension of the tip of the field oxide layer 902 toward the source region 1202 can be significantly reduced. For example, a spacing "$S_1$" extending the X-direction between the tip and an edge of the source region 1202 can be reduced to as low as about 0.2 m (when compared to the scenario of using existing methods to form a field oxide layer where the spacing is typically in the range of about 0.35-0.45 m), according to various embodiments of the present disclosure.

Figure 14:
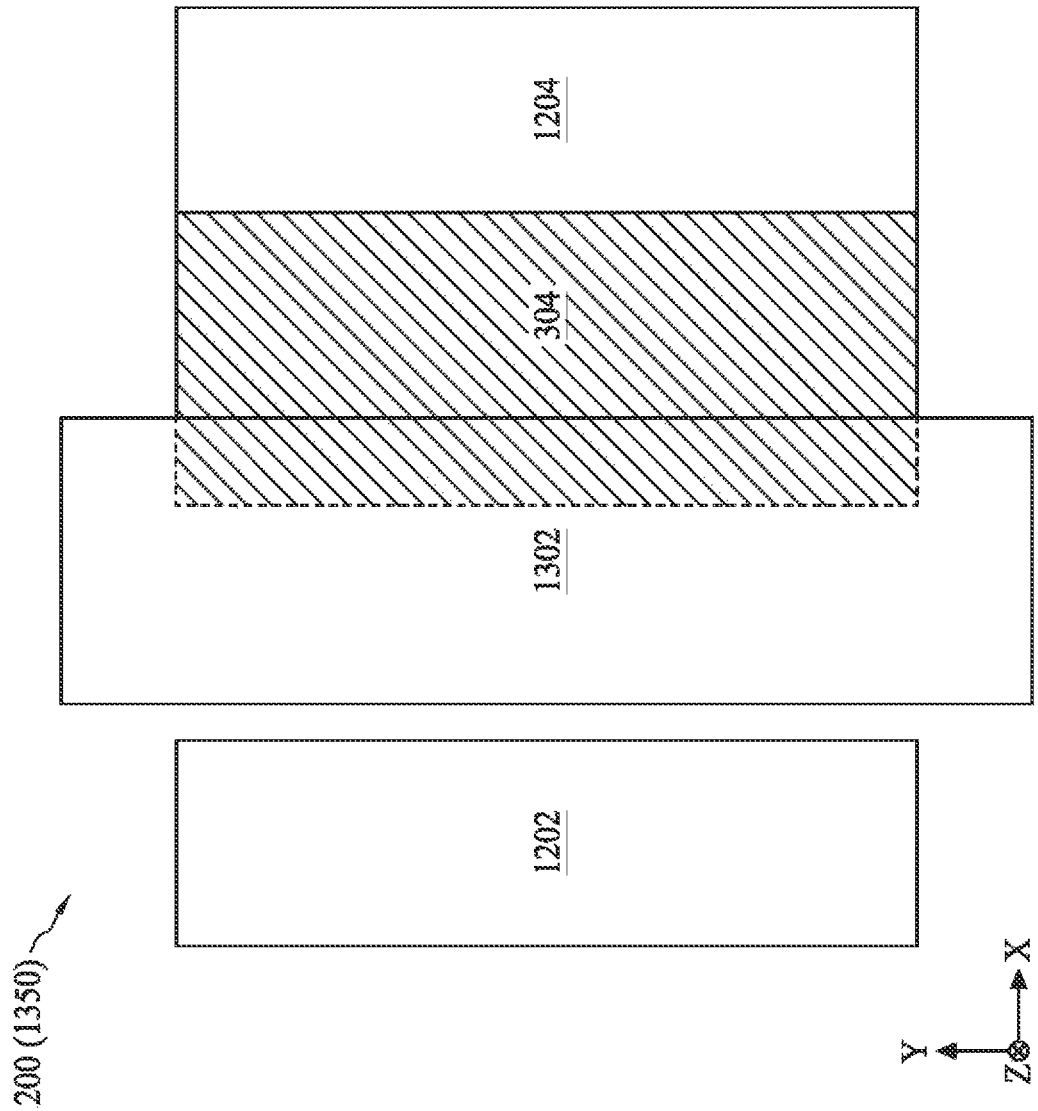

FIG. 14 illustrates a top view of an embodiment of a portion of the semiconductor device 200 (e.g., the high-voltage transistor 1350), in accordance with various embodiments. It should be understood that the top view of FIG. 14 is simplified for illustration purposes, and thus, some components (e.g., gate spacers 1104) may not be shown. As shown, the source region 1202 and the drain region 1204 of the high-voltage transistor 1350 are arranged with respect to the metal gate structure 1302 in an asymmetrical arrangement. For example, the isolation structure 304 is interposed between the drain region 1204 and the metal gate structure 1302, with a portion of the isolation structure 304 overlapped with the metal gate structure. And, on the other side of the metal gate structure 1302 (e.g., the side next to the source region 1202), no such an isolation structure is interposed therebetween.

Figure 15:
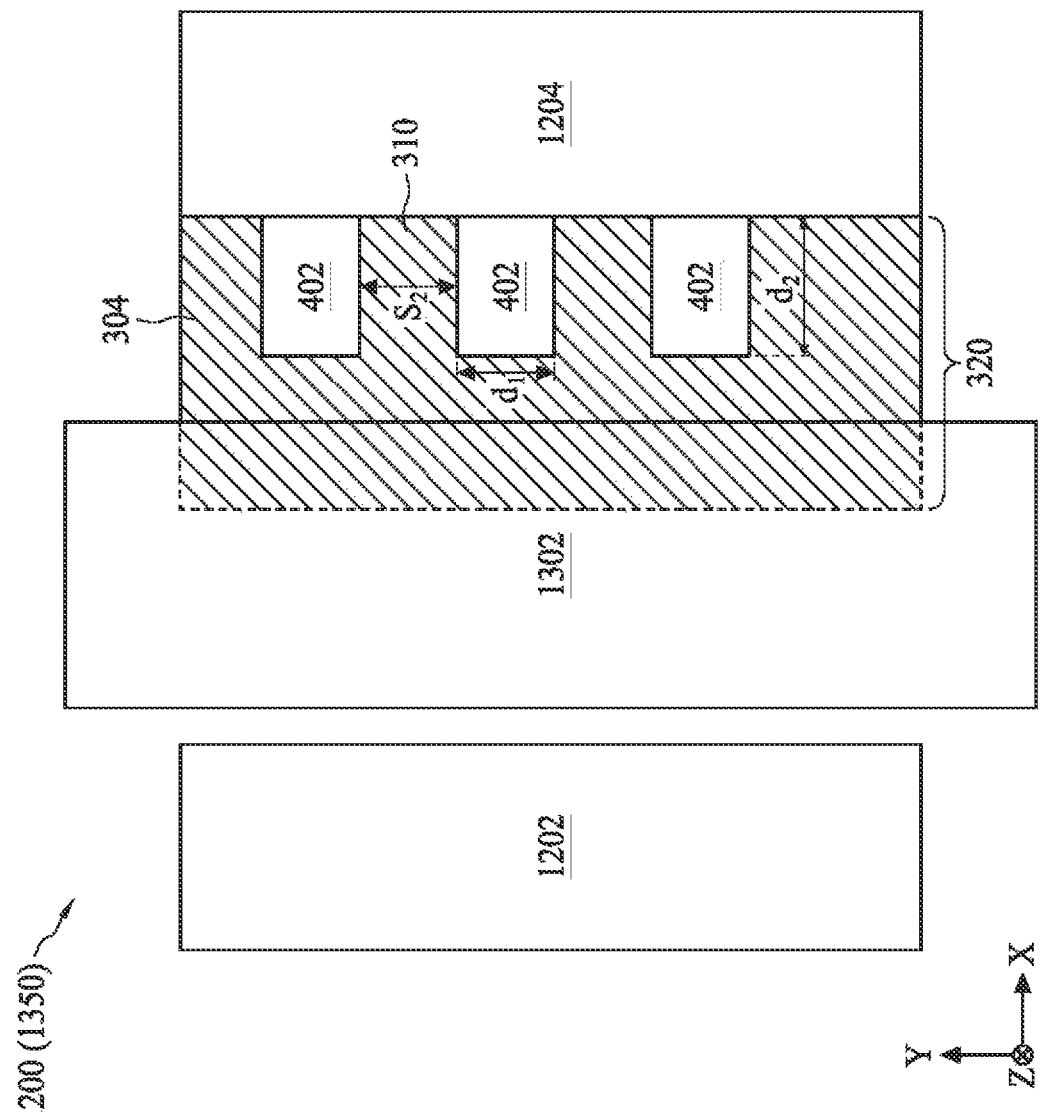

FIG. 15 illustrates a top view of another embodiment of a portion of the semiconductor device 200 (e.g., the high-voltage transistor 1350), in accordance with various embodiments. As shown, the isolation structure 304 is formed as a partially slotted structure. Such a partially slotted isolation structure 304 may include a plurality of projections 310 that have edges adjacent to an edge of the drain region 1204. Accordingly, a portion of the well region 402 is disposed between adjacent ones of the projections 310 (or within slots between the projections). It is understood that the number of projections may vary depending on the technology node process as well as the particular application. Also, the partially slotted isolation structure 304 can be formed by modifying a pattern layout of the trenches during the formation of the isolation structure 304 in the substrate 202 (FIG. 3). The high-voltage transistor 1350 with the partially slotted isolation structure 304 can have various advantages, which will be discussed as follows.

As shown in FIG. 15, the partially slotted isolation structure 304 includes a projection width "$S_2$" that is measured in a direction along the edge of the drain region 1204 (e.g., the Y-direction), a projection length "$d_2$" that is measured in a direction from the drain region 1204 to the source region 1202 (e.g., the X-direction), and a spacing "$d_1$" between adjacent projections 310. In various embodiments, the projection width ($S_2$) may range from about 0.8 μm to about 1.2 μm to provide a 3-dimensional electric field without hurting (e.g., substantially lowering) a breakdown voltage, and may rather improve on-state resistance with a larger active area of the well region 402 exposed when $S_2$ is smaller. Also, it has been observed that the projection length ($d_2$) may affect a breakdown voltage dramatically as $d_2$ is increased, and thus the projection length ($d_2$) may range from about 1 m to about 2 m. In some embodiments, the projection length ($d_2$) may be normalized to an overall length 320 of the partially slotted isolation structure 304 such that the projection length ($d_2$) is about 25% to 50% of the overall length 320. Further, it has been observed that the spacing ($d_1$) between adjacent projections 310 may range from about 1.5 μm to about 2 μm (with a fixed $d_2$=2 μm and $S_2$=1 μm) without hurting a breakdown voltage and may reduce an on-state resistance by 20% (as compared to a "full" isolation structure 304 of FIG. 14). It should be noted that the specific examples disclosed above are in reference to a certain technology node process and that other dimensions may be utilized in other technology processes without departing form the scope of the present disclosure.

Figure 16:
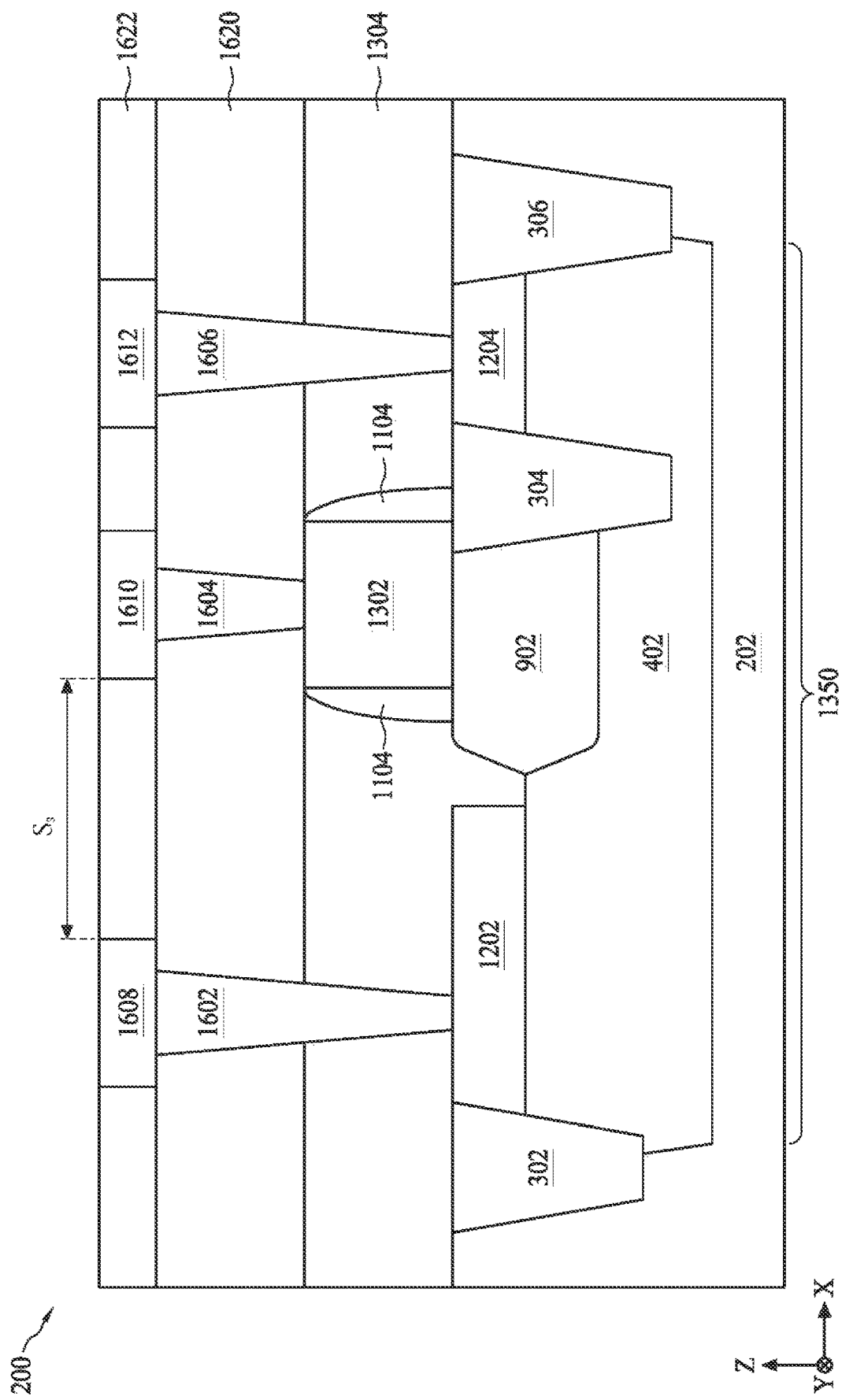

Corresponding to operation 126 of FIG. 1, FIG. 16 is a cross-sectional view cut along the X-direction of the semiconductor device 200 including a number of contact structures 1602, 1606, and 1608, in accordance with some embodiments.

As shown, the contact structures 1602 to 1608 are formed to electrically couple to the source region 1602, the metal gate structure 1302, and the drain region 1204, respectively. Prior to forming the contact structures 1602 to 1608, a second ILD 1620 may be deposited over the first ILD 1304, followed by an etching process to form a number of vertical trenches (or recesses) that extend through the ILDs 1304 and 1620 to respectively expose the source region 1202, the metal gate structure 1302, and the drain region 1204. These trenches may then be filled with a metallic fill material, thereby forming the contact structures 1602 to 1608. The metallic fill material includes at least one metal material selected from the group consisting of tungsten, copper, cobalt, ruthenium, titanium, tantalum, or combinations thereof. The metallic fill material can be deposited by a conformal deposition method, which can be, for example, chemical vapor deposition (CVD), atomic layer deposition (ALD), electroless plating, electroplating, or a combination thereof. Further, a number of interconnect structures 1608, 1610, and 1612 may be formed to electrically couple to the contact structures 1602 to 1608, respectively. Following the similar processes, a third ILD 1622 is formed over the second ILD 1620, following by an etching process to form trenches and filling those trenches with a metallic fill material.

The interconnect structures 1608, 1610, and 1612 are sometimes referred to as M1 interconnect structures. According to some embodiments, since the spacing $S_1$ between the source region 1202 and the field oxide layer 902 can be reduced, a spacing "$S_3$" extending the X-direction between the interconnect structures 1608 and 1610 that couple to the source region 1202 and the field oxide layer 902, respectively, can be reduced accordingly. In turn, a total area of the high-voltage transistor 1350 and its interconnect structures can be reduced, which allows more of such high-voltage transistors to be integrated within a limited area. Consequently, the Power-Performance-Area (PPA) of an integrated circuit having these high-voltage transistors can be greatly improved.

In one aspect of the present disclosure, a method for fabricating semiconductor devices is disclosed. The method includes forming a recess along a top surface of a semiconductor substrate. The method includes forming a nitride-based spacer layer extending along a first sidewall of the recess. The method includes forming a field oxide layer in the recess extending along a bottom surface of the recess, while a lateral tip of the field oxide layer is blocked from extending into any portion of the semiconductor substrate other than the recess by the nitride-based spacer layer.

In another aspect of the present disclosure, a method for fabricating semiconductor devices is disclosed. The method includes forming an isolation structure extending into a semiconductor substrate from a top surface of the semiconductor substrate. The method includes recessing the semiconductor substrate to define a first sidewall, a bottom surface, and a second sidewall, wherein the second sidewall, opposite to the first sidewall, exposes a portion of the isolation structure. The method includes forming an oxide liner layer extending along the first sidewall and overlaying the bottom surface. The method includes forming a dielectric spacer layer over the oxide liner layer that also extends along the first sidewall. The method includes thermally oxidizing at least a portion of the semiconductor substrate disposed beneath the bottom surface, thereby converting the portion of the semiconductor substrate that the oxide liner layer overlays the bottom surface into a field oxide layer, wherein the dielectric spacer layer is configured to block oxygen atoms from diffusing outside the first sidewall during the thermal oxidation step.

In yet another aspect of the present disclosure, a semiconductor device is disclosed. The semiconductor device includes a gate dielectric layer filling a recess of a semiconductor substrate, wherein the gate dielectric layer laterally extends with a tip terminated by a sidewall of the recess. The semiconductor device includes at least an isolation structure abutting a portion of the gate dielectric layer laterally opposite to the tip. The semiconductor device includes a source region laterally disposed adjacent the tip. The semiconductor device includes a drain region laterally disposed opposite the isolation structure from the gate dielectric layer. The semiconductor device includes a gate structure disposed over at least the gate dielectric layer.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating semiconductor devices, comprising:
   forming a recess along a top surface of a semiconductor substrate;
   forming a nitride-based spacer layer extending along a first sidewall of the recess, wherein a second sidewall of the recess laterally opposite to the first sidewall is defined by a shallow trench isolation (STI) structure extending into the semiconductor substrate; and
   forming a field oxide layer in the recess extending along a bottom surface of the recess, while a lateral tip of the field oxide layer is blocked from laterally extending beyond the first sidewall into any portion of the semiconductor substrate by the nitride-based spacer layer.

2. The method of claim 1, prior to forming the nitride-based spacer layer, further comprising forming a liner oxide layer extending along the first sidewall of the recess.

3. The method of claim 1, wherein a top surface of the field oxide layer is coplanar with the top surface of the semiconductor substrate.

4. The method of claim 1, prior to forming the recess, further comprising forming the STI structure extending into the semiconductor substrate.

5. The method of claim 4, further comprising:
forming a source region along the top surface of the semiconductor substrate, wherein the source region is laterally disposed next to the lateral tip of the field oxide layer;
forming a drain region also along the top surface of the semiconductor substrate, wherein the drain region is laterally disposed next to the STI structure that abuts the field oxide layer, the STI structure laterally separating the drain region and the field oxide layer; and
forming a gate structure over the field oxide layer and the STI structure.

6. The method of claim 5, wherein the gate structure is laterally confined within a collective area of the field oxide layer and the STI structure.

7. The method of claim 5, wherein a minimum distance between a tip of the source region and the tip of the field oxide layer is less than about 0.3 micron meters (m).

8. The method of claim 5, wherein a transistor, constituted at least by the source region, the drain region, the field oxide layer, the STI structure, and the gate structure, operatively serves as a high-voltage transistor, with a voltage applied to each of the drain region and the gate structure greater than about 20 volts (V).

9. The method of claim 1, subsequently to forming the field oxide layer, further comprising removing the nitride-based spacer layer.

10. The method of claim 1, wherein the field oxide layer has a thickness in a range from about 800 Å to about 1200 Å.

11. A method for fabricating semiconductor devices, comprising:
forming a shallow trench isolation (STI) structure extending into a semiconductor substrate;
forming a recess having a first sidewall and second sidewall along a top surface of the semiconductor substrate; and
forming a nitride-based spacer layer extending along the first sidewall of the recess, wherein the second sidewall of the recess laterally opposite to the first sidewall is defined by a shallow trench isolation (STI) structure extending into the semiconductor substrate.

12. The method of claim 11, further comprising:
prior to forming the nitride-based spacer layer, forming a liner oxide layer extending along the first sidewall of the recess.

13. The method of claim 11, further comprising:
forming a field oxide layer in the recess extending along a bottom surface of the recess, while a lateral tip of the field oxide layer is blocked by the nitride-based spacer layer from laterally extending beyond the first sidewall into any portion of the semiconductor substrate.

14. The method of claim 13, further comprising:
forming a source region along the top surface of the semiconductor substrate and laterally disposed next to the lateral tip of the field oxide layer; and
forming a drain region along the top surface of the semiconductor substrate and laterally disposed next to the STI structure, wherein the STI structure laterally separates the drain region and the field oxide layer.

15. The method of claim 14, further comprising:
forming a gate structure over the field oxide layer and the STI structure.

16. The method of claim 14, wherein top surfaces of the field oxide layer, the STI structure, the source region, and the drain region are coplanar with each other.

17. The method of claim 16, wherein a depth of the STI structure into the substrate is greater than a depth of the field oxide layer into the substrate.

18. A method for fabricating semiconductor devices, comprising:
forming a shallow trench isolation (STI) structure extending into a semiconductor substrate;
forming a recess having a first sidewall and a second sidewall laterally opposite to the first sidewall along a top surface of the semiconductor substrate;
forming a nitride-based spacer layer extending along the first sidewall of the recess, wherein the second sidewall of the recess is defined by the STI structure; and
forming a field oxide layer in the recess extending along a bottom surface of the recess, while a lateral tip of the field oxide layer is blocked from laterally extending beyond the first sidewall into any portion of the semiconductor substrate by the nitride-based spacer layer.

19. The method of claim 18, wherein the field oxide layer has a thickness in a range from about 800 Å to about 1200 Å.

20. The method of claim 18, further comprising:
subsequent to forming the field oxide layer, removing the nitride-based spacer layer.

* * * * *